United States Patent [19]

Geisler et al.

[11] Patent Number: 5,294,464
[45] Date of Patent: Mar. 15, 1994

[54] METHOD FOR PRODUCING A REFLECTIVE SURFACE ON A SUBSTRATE

[75] Inventors: Michael Geisler, Waechtersbach; Rudolf Koetter-Faulhaber, Hanau; Susanne Wuerz, Neuberg, all of Fed. Rep. of Germany

[73] Assignee: Leybold Aktiengesellschaft, Hanau, Fed. Rep. of Germany

[21] Appl. No.: 16,428

[22] Filed: Feb. 11, 1993

[30] Foreign Application Priority Data

Feb. 12, 1992 [DE] Fed. Rep. of Germany ........ 4204082

[51] Int. Cl.$^5$ ................................................. B05D 3/06
[52] U.S. Cl. ..................................... 427/489; 427/250; 427/255.1; 427/255.6; 427/255.7; 427/296; 427/491; 427/509; 427/515; 427/585
[58] Field of Search ............... 427/489, 491, 509, 515, 427/585, 404, 412.1, 250, 255.1, 255.6, 255.7, 296

[56] References Cited

U.S. PATENT DOCUMENTS

| | | | |
|---|---|---|---|
| 4,396,641 | 8/1983 | Imada et al. | 427/41 |
| 4,569,738 | 2/1986 | Kieser et al. | 204/173 |
| 4,776,298 | 10/1988 | Nied | 118/720 |
| 4,956,196 | 9/1990 | Wagner et al. | 427/38 |
| 5,093,152 | 3/1992 | Bonet et al. | 427/40 |

FOREIGN PATENT DOCUMENTS

| | | |
|---|---|---|
| 0057835 | 4/1987 | European Pat. Off. . |
| 3632748 | 4/1988 | Fed. Rep. of Germany . |
| 4010663 | 10/1991 | Fed. Rep. of Germany . |
| 4039352 | 6/1992 | Fed. Rep. of Germany . |
| 57-182328 | 2/1983 | Japan . |
| 63-182075 | 7/1988 | Japan . |
| 63-182076 | 7/1988 | Japan . |
| 1529995 | 10/1978 | United Kingdom . |
| 1559502 | 1/1980 | United Kingdom . |
| 2111064 | 6/1983 | United Kingdom . |

OTHER PUBLICATIONS

Sakata et al., Plasma Polymerized Membranes Journal of Applied Polymer Science, (no month available 1986), vol. 31, 1999–2006.

Inagaki et al. Glow Discharge Polymerization of Tetramethylsilane, (no month available 1983), Applied Polymer Sci., vol. 28, 3629–3640.

Liebel, Erfahrungen mit der Plasmavorbehandlung, Metalloberfläche 45, (no month available 1991), 10, pp. 443–449.

*Primary Examiner*—Bernard Pianalto
*Attorney, Agent, or Firm*—Felfe & Lynch

[57] ABSTRACT

A process gas atmosphere consisting essentially of (a) organosiloxanes and inert gas, or (b) pure silane or (c) silane plus inert gas is introduced into a vacuum chamber and exposed to microwaves to produce an electrocyclotron resonance in a plasma for coating substrates. The process is useful for producing an adherent coating on a plastic substrate, especially an intermediate coating for a reflective coating in an automotive headlamp.

19 Claims, No Drawings

METHOD FOR PRODUCING A REFLECTIVE SURFACE ON A SUBSTRATE

BACKGROUND OF THE INVENTION

The invention relates to a method for producing an adhesion-mediating coating on the surface of workpieces, preferably those of headlight reflectors made of plastic, having a vacuum tank in which the workpieces are exposed to a plasma coating process, with inlet and outlet openings in the tank, by which a process atmosphere determining the plasma coating process can be produced, during a controlled inlet and outlet of substances.

From DE-A 40 10 663, an apparatus and method are known for the production of coatings on the surface of workpieces, preferably headlight reflectors made of plastic. It involves especially a special surface treatment of three-dimensional substrate surfaces, the object being to achieve a corrosion-resistant and nonsmearing mirror surface.

What is involved is a PCVD coating process with a microwave-ECR plasma coating source and a so-called rotary cage situated in the vacuum chamber and carrying the substrates past the coating source in a planetary motion controlled by frequency and phasing.

The coating process provides a plurality of process steps which first modify the substrate on its surface within the scope of a noncoating plasma pretreatment so that functional groups will form on it, such as hydroxyl-carbonyl or amino groups. After that, for improved adhesion mediation, a coating formed from a SiC or SiCO gas atmosphere is deposited onto the substrate surface. This is followed by the application of an aluminum coating to the substrate. In a final step, a protective coating of the same coating composition as the above-described adhesion mediating layer is applied to the metallized substrate to increase its resistance to corrosion and smearing.

Further testing has shown, however, that many substrate materials, such as plastics and varnishes, undergo irreversible damage to the substrate surface under the process conditions described in DE-A 40 10 663 This is especially true of the first monolayers of plastic substrates, where damage is caused by ultraviolet rays occurring in the plasma and by collision of high-energy plasma particles with the substrate surface. Such disadvantageous interactions with the substrate surface depend on the types of particles included, and on the distance between substrate and plasma, as well as on the prevailing particle partial pressures.

SUMMARY OF THE INVENTION

According to the invention the workpieces are exposed to a plasma coating process in a tank, with inlet and outlet openings, by which a process atmosphere determining the plasma coating process is controlled so that the above-mentioned surface damage to the substrates will be avoided and an adhesion-mediating coating will be produced which will be chemically compatible with most known plastics and varnishes. Furthermore, the process times and costs necessary for such production are reduced.

According to the invention, the process gas atmosphere consists essentially of organosiloxanes and inert gas or of pure silane or of silane plus inert gas.

DETAILED DESCRIPTION OF THE PREFERRED EMBODIMENT

The basic idea essential to the invention is the application of an adhesion-promoting coating to a substrate as an intermediate coating. Such coatings are also frequently called "precoats." Furthermore, the coating can be applied to coatings already present on the workpiece as a coating for protection against external corrosive influences, such as aggressive media.

For the production of such coatings on workpieces, plasma-enhanced vacuum processes are preferably used. Other known coating processes, however, can also be performed.

At low process gas pressures within the process chamber the plasma-enhanced coating of plastic surfaces often results in damage to the plastic surface due to the plasma radiation, as already mentioned. The consequence is a poorly adherent coating, especially under the influence of the corrosive medium. To achieve a sufficiently uniform coating of three-dimensional workpieces, however, the coating particles must be provided with a great average free trajectory in the processing atmosphere. This, as a rule, is achieved only at low process pressures.

The process according to the invention, by the admixture of a monomer, e.g., an organic silicon compound or silane with a noble gas such as helium, as a collision partner, makes it possible to coat three-dimensional workpieces even at pressures of several Pascals, and at distances of the workpiece from the plasma source of more than 10 centimeters.

Upon mixing the process gas, such as tetramethyldisiloxane, with a noble gas such as helium as the carrier gas, it was discovered that damage to the substrate surface is surprisingly nonexistent. Experiments likewise showed that even pure silane as the process gas atmosphere eliminates damage to the coating.

As a common method of testing the adherence of coatings to workpieces, the well-known caustic soda solution test, also called the Fiat standard test, is used. Metal coatings adhering but poorly to the workpiece surface quickly dissolve in the solution. Experiments showed that, with the adhesion-mediating coating deposited according to the invention, additional coating deposits survive the caustic soda solution test in lasting adherence to the substrate.

As previously mentioned, a plasma-enhanced CVD process is used which operates with process pressures within the vacuum tank between 0.01 Pa and 100 Pa. Preferably, microwave input into the plasma area within the process chamber is used.

The microwave power input for the production of plasma and plasma maintenance amounts to between 1 kW and 50 kW per cubic meter of plasma volume.

The process gas mass flow necessary for plasma stability is between 50 and 23000 hPa*l/min per cubic meter of plasma volume. The suction capacity of the pumps regulating the outflow of material is between 400 and 40000 l/sec of nitrogen per cubic meter of plasma volume.

With the method described, both continuous coatings with thickness greater than 100 Å and coatings with thicknesses under 20 Å that do not completely cover the substrate surface can be made. Both types of coating result in adhesion-promoting coatings in the stated manner.

In the case last mentioned, what is involved is less a coating in the literal sense than it is a surface modification.

The extremely slight coating thicknesses furthermore permit very short processing time, which in the case of statistical coating can amount to less than one second. The method according to the invention is thus quicker than those known in the state of the art; such a great reduction of processing time results in a considerable reduction of manufacturing costs.

Following the application of the adhesion promoting coating, a reflective layer of aluminum or other metal of from 700 Å to 1 μm is applied. The metal layer can be applied by either a vapor deposition process, as disclosed in U.S. Pat. No. 4,956,196 (incorporated herein by reference), or by a sputtering process.

For workpieces having complex three dimensional surfaces, a sputtering gas pressure of over 6 μmbar using a heavy inert gas such as krypton is preferred.

Following application of the reflective coating, it is preferable to apply a protective coating of the same composition as the adhesion promoting coating, according to the same method.

The foregoing is exemplary and not intended to limit the scope of the claims which follow.

We claim:

1. Method for producing a reflective surface on a substrate, said method comprising the steps of
   placing a plastic substrate to be coated in a vacuum chamber,
   evacuating said chamber,
   introducing into said chamber a process gas atmosphere which consists essentially of one of (a) organosiloxanes plus helium, (b) pure silane, and (c) silane plus helium,
   generating a plasma from said process gas atmosphere, thereby producing an adhesion promoting layer on said substrate, and
   applying a reflective layer on said adhesion promoting layer.

2. Method as in claim 1 wherein said process gas atmosphere consists essentially of tetramethyldisiloxane and helium.

3. Method as in claim 1 wherein said process gas is at a pressure between 0.01 and 100 Pa.

4. Method as in claim 1 wherein said microwaves input electrical power of 1 kW to 50 kW per cubic meter of plasma volume.

5. Method as in claim 1 wherein said process gas atmosphere is pumped through said vacuum chamber at a mass flow between 50 and 23,000 hPa* l/min per cubic meter of plasma volume.

6. Method as in claim 5 wherein said process gas is pumped through said chamber and said plasma is maintained until said process gas produces a coating between 60 Å and 120 Å thick on said substrate.

7. Method as in claim 1 wherein said reflective layer is a metallic layer.

8. Method as in claim 7 wherein said metallic coating is aluminum.

9. Method as in claim 1 comprising the additional step of applying a protective layer over said metallic layer, said protective layer being applied by the steps of
   introducing into said chamber a process gas atmosphere which consists essentially of one of (a) organosiloxanes plus inert gas, (b) pure silane, and (c) silane plus inert gas, and
   exposing said process gas atmosphere to microwaves in order to generate a plasma, thereby producing a protective layer on said metallic layer.

10. Method as in claim 9 wherein said protective layer is applied by introducing into said chamber a process gas atmosphere consisting essentially of one of (a) organosiloxanes plus helium, (b) pure silane, and (c) silane plus helium.

11. Method as in claim 10 wherein said protective layer is applied by introducing into said chamber a process gas atmosphere consisting essentially of tetramethyldisiloxane and helium.

12. Method as in claim 1 wherein said process gas atmosphere consists essentially of pure silane.

13. Method as in claim 1 wherein said process gas atmosphere consists essentially of silane and helium.

14. Method as in claim 1 wherein said process gas atmosphere consists essentially of organosiloxanes and helium.

15. Method as in claim 1 wherein said plasma is generated by exposing said process gas atmosphere to microwaves.

16. Method as in claim 1 wherein said protective layer is applied by introducing into said chamber a process gas atmosphere consisting essentially of organosiloxanes plus helium.

17. Method as in claim 1 wherein said substrate is plastic.

18. Method as in claim 1 wherein said protective layer is applied by introducing into said chamber a process gas atmosphere consisting essentially of pure silane.

19. Method as in claim 1 wherein said protective layer is applied by introducing into said chamber a process gas atmosphere consisting essentially of silane and helium.

* * * * *